March 14, 1967 J. C. HAENICHEN 3,309,245

METHOD FOR MAKING A SEMICONDUCTOR DEVICE

Original Filed Aug. 23, 1962

INVENTOR.
John C. Haenichen

BY

Mueller, Aichele & Rauner

ATT'YS.

United States Patent Office 3,309,245
Patented Mar. 14, 1967

3,309,245

METHOD FOR MAKING A SEMICONDUCTOR DEVICE

John C. Haenichen, Scottsdale, Ariz., assignor to Motorola, Inc., Chicago, Ill., a corporation of Illinois Original application Aug. 23, 1962, Ser. No. 218,904, now Patent No. 3,226,611, dated Dec. 28, 1965. Divided and this application June 18, 1965, Ser. No. 465,012
6 Claims. (Cl. 148—187)

The specification and drawing of the present application correspond to those in applicant's copending application Serial No. 218,904, filed August 23, 1962, Patent No. 3,226,611, and the claims are directed to the method disclosed in said latter application, as a divisional application thereof, and claimed in applicant's related applications Serial No. 256,736, filed March 18, 1963, Patent No. 3,226,612, Serial No. 265,649, filed March 18, 1963, Patent No. 3,226,613, and Serial No. 321,070, filed November 4, 1963, Patent No. 3,226,614.

This invention relates to stabilized or passivated silicon semiconductor devices and more particularly to a method of fabricating stabilized planar NP silicon diodes and PNP transistors suitable for high voltage operation.

The necessity for making semiconductor devices stable and reliable is readily apparent when one considers the importance of their use in civil and military electronics where in some applications hundreds or thousands of such devices are employed together in a dependent manner. Semiconductor devices that have been stabilized in certain ways are sometimes referred to as passivated devices.

Among the most stable and reliable semiconductors are those of silicon of a type known as planar passivated devices. To date, however, planar passivated NP diodes and PNP transistors have had a serious limitation in that they have not been suitable for use at high voltages. There is a ready commercial market for high voltage planar passivated devices and considerable research and development effort has gone into the solution of this problem.

The difficulty in preparing high voltage NP diodes and PNP transistors of the planar passivated type involves a number of related processing and structural factors which cause such planar passivated devices of an intended high voltage design to act like an entirely different and unsuitable device.

Planar passivated NP diodes and PNP transistors are stable and reliable largely because a protective film of silicon dioxide or glass covers portions of the junctions that might normally change or degrade if exposed. It happens that when the proper silicon requirements for high voltage operation are met in the P regions of these devices, the protective glass or silicon dioxide film causes this material to act as if it were N-type nearest the film. This false N region connects to the true N region and provides a path throgh which current can flow in a unique way which will be discussed later. The false N region is called an N-type induced channel and causes such a serious change in some of the device characteristics that only the low voltage type of planar passivated devices have been feasible in the past.

A really superior NP diode or PNP transistor would be one having the desirable characteristics of the planar passivated structures but operable at high voltages as well.

Accordingly, it is an object of this invention to provide a means by which high voltage planar passivated devices may be made.

It is another object of this invention to provide a means of constructing induced N regions or channels of a desired shape.

A feature of this invention is the use of well-known selective diffusion techniques to lower the resistivity of pi silicon in order to interrupt induced N regions occurring at silicon dioxide-pi silicon and glass-pi silicon interfaces.

In the accompanying drawings wherein conductivity types have been indicated as PNP devices only for illustrative purposes:

Figures 1, 2, 3, 4, 5, 6, 6A:
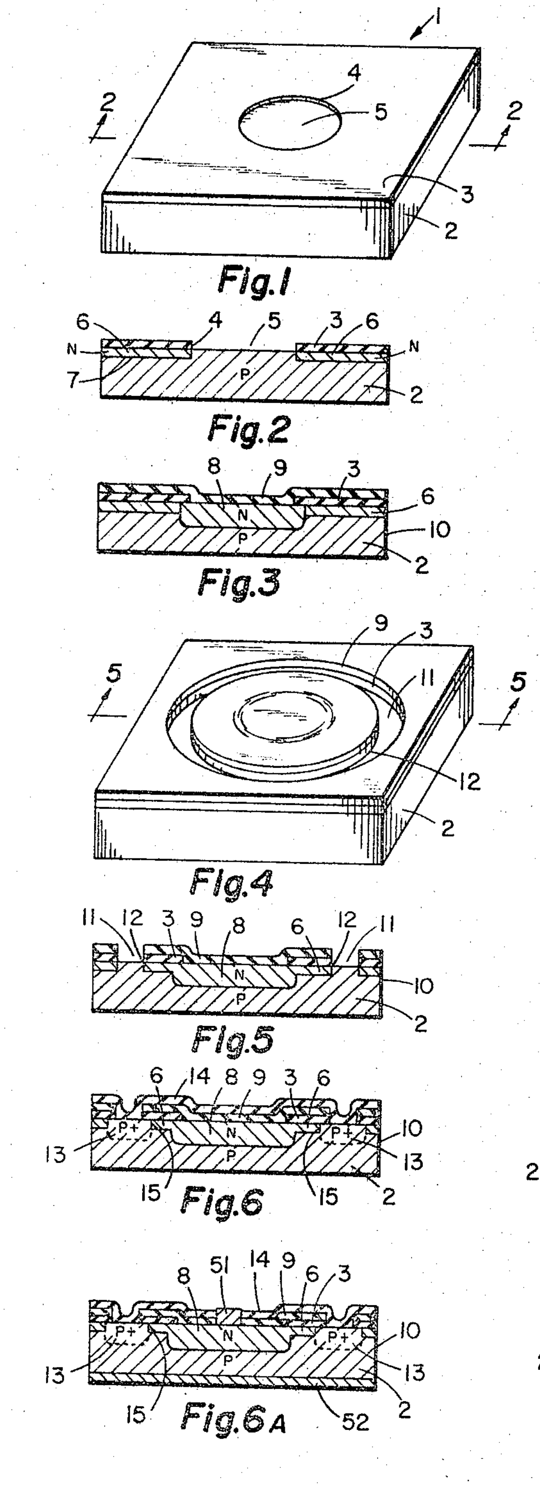
FIG. 1 shows a silicon dioxide coated silicon die after a region of the silicon dioxide has been selectively etched away.
FIG. 2 is a cross section through the die of FIG. 1.
FIG. 3 shows the die following diffusion of the silicon.
FIG. 4 shows the die following preparation for a subsequent diffusion.
FIG. 5 is a cross section through the die of FIG. 4.
FIG. 6 is a cross section through the die of FIG. 3 following the diffusion treatment.
FIG. 6A is a cross section similar to FIG. 6, and showing the condition of the die after contacts have been applied to it.

In accordance with this invention excellent planar passivated NP junction devices and planar passivated PNP transistors may be made that are suitable for high voltage use.

Devices of the planar passivated type suitable for high voltage use might be expected to consist of at least one diffused N region within a region of pi-silicon, i.e., high resistivity P-type silicon, to form an NP junction having a boundary at the surface of the silicon and covered with a passivating film. Unfortunately, the passivating film induces an N-type channel at the interface between the film and the pi silicon, and the channel seriously degrades certain parameters of the device. It has been found that such a channel may be interrupted by selectively diffusing P impurity into the pi silicon lying just outside the periphery of the surface portion of the NP junction, and the degrading effect of the channel can be avoided in this manner.

The following text and accompanying drawings are to explain more fully the nature of high voltage planar devices and their method of fabrication according to this invention.

As is well-known, by masking off portions of silicon with diffusion resistant materials, diffusion may be confined to regions at selected areas of the silicon; this is selective diffusion. Some impurity materials diffuse very slowly through silicon dioxide and certain glasses so that it is possible to partially cover or mask regions of a silicon wafer with a film of one or more of these in order to prevent some regions being diffused to any great extent by impurity materials of this kind, while allowing diffusion to take place at other regions. When rectifying junctions are formed by selective diffusion, as they are in planar passivated devices, the surface portion of the junction lies beneath a film of silicon dioxide or glass. This is the case because the impurity being diffused at an opening in the film diffuses in all directions into material having a lower concentration of this impurity so that the silicon also becomes diffused a slight distance under the film edges bounding the exposed regions; therefore, the junction at the surface of the silicon lies beneath a silicon dioxide or glass film. If the film at the silicon was thermally formed, that is, formed by heating and oxidizing the silicon wafer, the silicon-film interface will be very clean as contaminants will tend to remain at the surface since the film forms beneath them. By virtue of this fact, junctions at this interface will be very clean and, therefore, be more free of surface contaminants which may ionize. Ordinarily, due to the intense electric field across a back biased rectifying junction, surface conduction by ions will contribute greatly to junction leakage current.

Planar passivated junctions which are junctions prepared and protected as just described tend to be stable and reliable, not only because of their intrinsic separation from ionizable surface contaminants, but also because the dielectric and insulating qualities of silicon dioxide or the glasses ordinarily covering the junction at the surface cause a reduction in the electric field and in conduction at this region. The silicon dioxide or glass covering the junction is referred to as a passivating film.

As previously mentioned, a major problem common to NP planar passivated junction devices which, of course, includes NP planar passivated diodes and PNP planar passivated transistors, has been that of making these devices suitable for high voltage operation, i.e., making devices with a high breakdown voltage characteristic. To have high breakdown voltages, it is necessary that the P material of the NP junction have a fairly high resistivity. High resistivity P-type silicon is called pi silicon. The planar passivated diode has a passivating film of silicon dioxide or glass covering the surface portion of the NP junction which normally causes a smaller reverse current. However, when the P material is of high resistivity, the reverse current becomes much greater and the diode has a current versus voltage curve similar to that of a current limiting device.

A current limiter structure based on a well-known physical model, requires that a flat thin region of relatively high resistivity silicon, called a channel, lie adjacent a region of silicon of the opposite conductivity type; one terminal of the device shorts or resistively connects both types of material at one region and the other terminal is connected at a different region to high resistivity material of just one type. The device is so constructed that current carriers flow preferentially through the thin high resistivity material, and when a voltage above a certain critical voltage, called the "pinch off voltage," is applied across the terminals of the device, a depletion region lying both within and outside of the channel closes off the channel and further acts so that a nearly fixed voltage drop exists across the length of it. A particular voltage drop across the channel of a device causes that part of the depletion region within it to assume a given form and this largely determines what the electrical resistance of the channel will be. Therefore, at voltages above the "pinch off voltage," the nearly constant voltage across the channel fixes its resistance and under these conditions the current that can flow through it is limited to some nearly constant value. The device structure is such that the voltage difference between the applied and the pinch off voltage simply causes further thickening of the depletion region in a space outside of the channel and acts as if it were across a simple reverse biased junction so that the small increase in the current occurring due to this particular voltage difference is of the order of junction leakage current. The device will limit current up to a given maximum applied voltage where voltage breakdown occurs.

In the planar passivated NP junction the silicon dioxide or glass in some manner causes the lightly doped or high resistivity P-type semiconductor material beneath its surface to act as if it were a high resistivity N-type channel, and since this channel usually leads to some high leakage, high recombination or other high conductivity region between the N channel and the pi silicon which is roughly equivalent to the shorted or resistively connected terminal region of the current limiter, this whole structure is then somewhat like that of the previously discussed semiconductor current limiting device. Hence, for this structure, a current versus reverse voltage curve will resemble that of a current limiter rather than that of an ordinary back biased junction. The formation of an apparent N region of this kind is called induced channeling. Also, since the channel that is induced extends the N region of the NP junction to all of the adjacent area of pi silicon that is coated with a continuous silicon dioxide or glass film, there may be quite a large capacitive effect associated with the phenomenon. It is interesting to note that when the film is removed, the current versus voltage curve becomes that of an ordinary unpassivated reverse biased junction. In the past, in order to have the inherent reliability and very low reverse currents, it has been both necessary and desirable that the silicon dioxide or glass cover the NP surface region so that planar passivated NP junctions have necessarily been of the low breakdown voltage type since wafers of P-type silicon of a low resistivity had to be used to prevent the induced channeling or current limiter effect from occurring.

The mechanism by which N induced channels are formed is not known in this case. It is believed that certain positive ions such as hydrogen ions diffuse into and are held by the glass or silicon dioxide film and so give it a positive charge which induces a negative charge at the surface of the pi silicon. If enough electrons are brought to the surface so that their numbers are greater than the number of available holes, this region will act as if it were N-type material since any conduction which occurs will be due in the largest part to the flow of these electrons.

An NP junction having the characteristics of the usual planar passivated junction but with a high breakdown voltage as well, can be made using ordinary device design considerations if induced channeling can be prevented or its effects eliminated or minimized. The fabrication process to be illustrated and described for making high voltage planar passivated NP junction devices uses a means of minimizing the effect of the induced channel and accomplishes this by interrupting the channel by a solid state diffusion operation.

FIG. 1 is a rectangular semiconductor element 1 consisting of a die portion 2 cut from a large wafer (not shown) of high resistivity P-type silicon called pi silicon upon which a region of silicon dioxide 3 has been thermally grown. A circular region 4 of the silicon dioxide has been removed to expose the underlying silicon and N impurity will be selectively diffused into the silicon at this region 5. The masking action of the silicon dioxide prevents significant amounts of N impurity from diffusing into the covered regions.

FIG. 2, a sectional view of the die taken at 2—2, shows a layer of silicon dioxide 3 at just the upper surface of the silicon, but it should be understood that in practice all regions of the silicon that are not intended to be significantly altered by diffusion may be covered with a silicon dioxide or glass film. In practice, it is common to fabricate many semiconductor units at once on a single wafer. Thus, any die shown in the drawings represents part of a larger wafer. However, the description will be simplified by referring to individual die units.

An N-type channel region 6 is formed at the silicon dioxide-pi silicon interface and is represented schematically as the region lying between the solid line 7 of FIG. 2 and the silicon dioxide 3.

In FIG. 3, the wafer of silicon is shown after having been diffused with phosphorus impurity to form an N region 8. The phosphorus was supplied from a layer of phosphosilicate glass 9 which was formed initially on the silicon in a prediffusion step. A prediffusion step of this type to form an impurity source at the surface of the silicon is sometimes referred to as an impurity predeposition and will be discussed further on. The N-type diffused region 8 is electrically in direct contact with the N-type channel region 6 so that the NP junction exists across the surface of the wafer and terminates as a surface NP region 10 at the exposed edges where the die was cut from the wafer. The junction formed at the interface of the N region 8, and the P region 2 in the absence of a channel 6 is shown in FIG. 3 as extending to the surface, but it is understood that it extends laterally as shown in FIG. 5, with the channel 6 formed.

For illustrative purposes, discrete regions of silicon dioxide and glass are shown in the drawings. It should be understood that due to the interaction of the glass and silicon dioxide at prediffusion and diffusion temperatures, the silicon dioxide becomes a glass. The glasses will also interact and change in composition, and the existence of discrete boundaries as illustrated between glasses formed and treated as these are, is questionable.

In order to eliminate the current limiter action of the diode, a ring of the silicon dioxide 3 and phosphosilicate glass 9 is etched from the die surface as shown in FIG. 4. The annular ring 11 was etched through the silicon dioxide and glass to expose a region of pi silicon lying a small distance outside of the original NP junction of the device. This is shown more clearly in FIG. 5. The opening 11 has interrupted the induced channel 6 but this alone is an inadequate treatment since etching has also exposed a continuation of the device junction formed by the N channel and the pi silicon. The periphery of this continuation is at the inner edge 12 of the etched annulus and the device junction does not have the low leakage currents of a passivated junction since the continued junction region terminates at the edge of the silicon dioxide or glass rather than at a boundary lying fully beneath it.

In FIG. 6, the exposed silicon is shown after being selectively diffused with P impurity to form a low resistivity P region 13. The P impurity source for this diffusion was provided by a layer of borosilicate glass 14 which was formed on the wafer in an impurity predeposition step prior to the diffusion. The diffused P region 13 extends back under the silicon dioxide so that the termination 15 of the NP junction so formed is moved back under the silicon dioxide and glass. The junction is now protected by the passivating film so that it has the low leakage associated with planar passivated devices, and in addition the channel cannot extend into the more heavily P-type diffused region 13 as the concentration of the induced negative charges is not as great as the concentration of available holes due to the increased concentration of P impurity. This P region will be subsequently referred to as the anti-channel region, or as a channel-interrupting region.

An NP junction thus formed will have a high breakdown voltage if the diffused low resistivity P anti-channel region 13 is located away from the diffused N region. Although the resistivity of this P-type anti-channel region may be very low, the small remaining part 6 of the induced channel lying between the diffused N region 8 and the anti-channel region 13 has the characteristics of high resistivity N-type material, so that if this remnant of the induced region is not too small a reasonably wide depletion region will expand into it to satisfy the high breakdown voltage condition there. Thus a high breakdown voltage characteristic of the junction is attained by constructing the device so that all low resistivity material of either P or N conductivity type proximate to the junction has an adequately thick high resistivity region of the other conductivity type opposite it.

In FIG. 5, the line of the junction between the regions 8 and 2 extending along the channel 6 to the region 13 is shown solid. Because there is no junction between regions 13 and 2 of the same conductivity type the line around region 13 is shown dotted.

FIG. 6A is a cross sectional view of the zener diode after metal contacts 51 and 52 have been applied respectively to N region 8 and to P region 2.

Figures 7A, 7B, 7C, 7D, 7E, 7F, 7G, 7H:
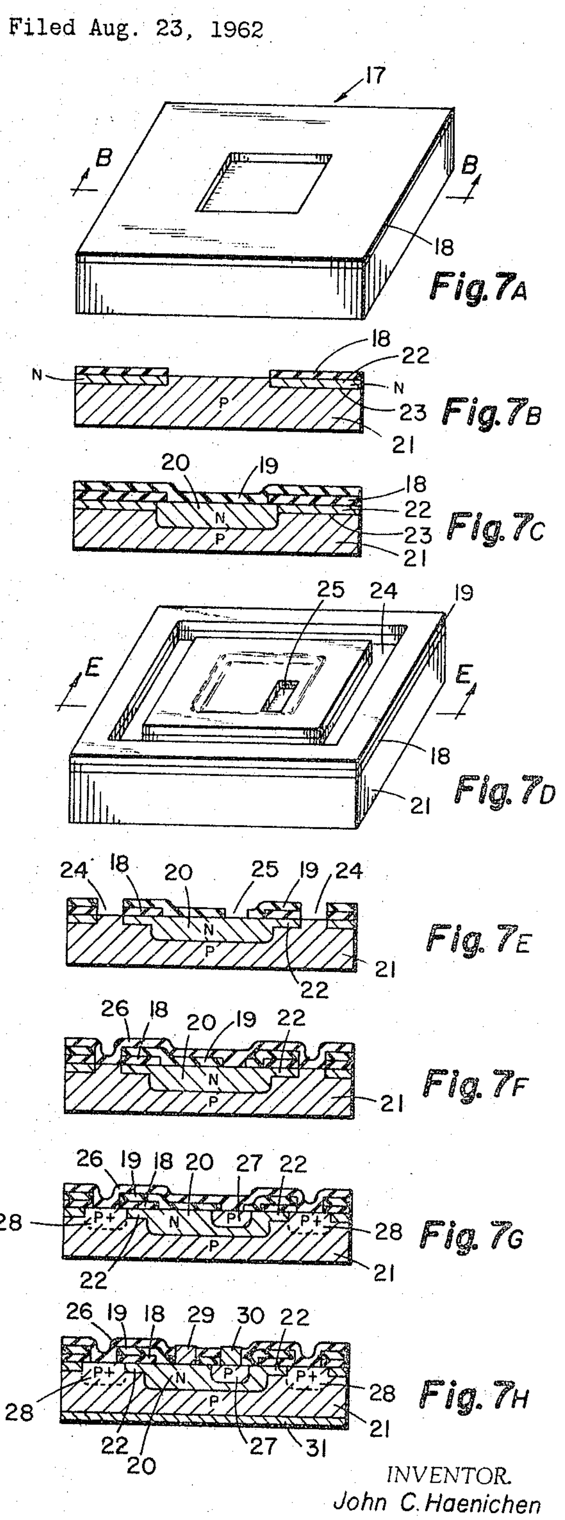
FIGS. 7A to 7H inclusive show the steps in the preparation of a nonchanneling PNP planar passivated transistor.

Planar passivated PNP transistors having a high collector-to-base breakdown voltage may be prepared in much the same manner as the previously described high voltage planar passivated diode. Suitable steps for fabricating such a device are illustrated in FIGS. 7A through 7H. A semiconductor element 17 consisting of pi silicon partially covered with thermally grown silicon dioxide 18 is selectively diffused with N impurity from a layer of predeposited phosphosilicate glass 19 to form an N region 20 and establish a collector-base junction. The N diffused region 20 is the base region of the device, and the pi region 21 just outside of this region is the transistor collector. The induced N region 22 is represented schematically as lying between the solid line 23 and the silicon dioxide 18. In FIG. 7C, the junction which would be formed between the N region 20, and P region 21, in the absence of the channel 22 is shown coming to the surface for illustrative purposes.

After the N diffusion, the previously diffused regions remain covered with phosphosilicate glass 19. Phosphosilicate glass is such that it may be used as a diffusion mask against boron impurity in the same manner as the silicon dioxide was used in masking against phosphorus.

Portions of layers 18 and 19 are etched away so that two regions of silicon 24 and 25 are exposed as shown at the step of FIG. 7E. The semiconductor element is diffused with P impurity from a predeposited film of borosilicate glass 26 to form the emitter region 27, and the anti-channel region 28 of P diffused material is made at the same time with the same exposure to P impurity. The finished structure is shown in FIG. 7G.

Following this, regions of glass are removed to expose silicon at the base region 20 and the emitter region 27 of the transistor. The base and emitter may then be metallized to provide contacts 29 and 30, so that electrical connections may subsequently be made to the contacts. A collector contact 31 may be metallized on the other side of the die.

The region 28 has the configuration of the exposed area 24 of FIG. 7E, surrounds the base region 20, and is spaced away from the position of what would be an original NP junction shown in FIG. 7C.

The P diffusion to form the anti-channel P region in planar passivated devices is noncritical, having just the requirements that the resisitivity of the diffused P region be less than of the order of one ohm-centimeter near the surface and that the P impurity be of a suitable type that may be selectively diffused such as boron. A typical silicon dioxide or glass thickness for masking during diffusion of the P region on the NP diode described is one micron. The glass film thickness for the transistor is governed by the requirements of the length of time and the temperature for forming the emitter junction by diffusion but 4000–5000 angstrom units is suitable for most planar device diffusions.

Silicon dioxide is thermally grown by exposing silicon at a temperature in the order of 1100° C. to water vapor. The water vapor is customarily brought into contact with silicon by bubbling oxygen or hydrogen gas through water to saturate it and then flowing the gas-water vapor over the silicon. Atlernatively, water is vaporized by boiling and the steam is allowed to flow over the hot silicon. The silicon is usually heated and oxidized in a furnace of the combustion tube type. The formation of impurity bearing glasses is discussed later in diffusion processing.

The invention as described thus far has been somewhat specific in its application, since it is largely concerned with the solution of a problem peculiar to NP planar passivated junctions. However, a more fundamental use of the techniques used in solving this problem would be that of selectively diffusing anti-channel regions so that N-type induced channel regions of various shapes may be formed and/or isolated and it is intended that the scope of the invention include this use. Most simply, a channel of a given size and shape may be formed by oxidizing pi silicon to form silicon dioxide having a resulting underlying N-type induced channel, and selectively etching the silicon dioxide away so that the desired shape of silicon dioxide and channel is left and then diffusing the P-type anti-channel region into the silicon not covered by the silicon dioxide.

The induction of N-type channels in planar devices when passivating and similar films of highly resistive inorganic material are formed on pi silicon is largely independent of the device design. It is intended that the scope of the invention also include the interruption of such channels in order to improve devices other than planar devices by selectively diffusing P-type impurity into this P-type silicon in order to lower the resistivity below the level at which such channels may exist in selected regions at the surface of the silicon.

General fabrication techniques for planar passivated devices are known in the art. Examples of these techniques are given in the following text.

Well-known photolithographic techniques are very useful in removing selected regions of silicon dioxide and impurity bearing glasses. A photosensitive resist that is not attacked by hydrofluoric acid is applied in liquid form to the silicon in a uniform coating and allowed to dry. A pattern consisting of transparent and opaque areas, the opaque areas corresponding in shape to the regions that are to be removed, is placed against the surface of the resist covered silicon and then this system is exposed to ultraviolet light. The resist is developed and the areas of the resist that were shaded from the light by the opaque areas of the pattern are washed away uncovering the underlying silicon dioxide or glass film. The silicon is then placed in hydrofluoric acid and the unprotected areas of this film are etched away. After cleaning and removal of the remaining photo-resist, the silicon may be diffused.

Although the diffusion used to form the anti-channeling region is a diffusion using a P impurity such as boron from a borosilicate glass impurity source, to be described later, the preparation and use of the calcium phosphosilicate glass or another functionally equivalent phosphosilicate glass as an N impurity (phosphorus) source is directly important to this process. Calcium phosphosilicate glass may be used in the preparation of N regions of silicon and then, since it also has an effective masking action against the diffusion of boron, it may be used at the same time, and where conditions warrant, both as a phosphorus source and as a masking material for selectively diffusing boron into silicon.

The calcium phosphosilicate glass is formed on the surface of the silicon in a prediffusion operation by heating it in a closed system in the presence of a source glass previously prepared by heating calcium oxide and phosphorus pentoxide together. After a suitable thickness of calcium phosphosilicate glass has been formed on the silicon, the silicon is transferred to a diffusion furnace where the silicon is reheated to diffuse the phosphorus from the glass into the silicon. The prediffusion of the silicon using a source glass consisting of fifteen parts by weight of phosphorus pentoxide to one part of calcium oxide may be performed by heating the glass and the silicon in a closed platinum box within a furnace at a temperature of 800° C. for a period of time of about ten minutes in a nitrogen atmosphere. Silicon and silicon dioxide react with the phosphorus pentoxide and calcium oxide vapors and a film of calcium phosphosilicate glass forms on the silicon. After prediffusion the silicon wafers are transferred to another furnace of the combustion tube type where they are heated at a temperature of 1100° C. for one hour in water vapor and then are heated for two and one-half hours longer in the same furnace in an atmosphere of flowing dry oxygen. Water vapor for the furnace is supplied by vaporizing water by boiling and forcing the steam to flow through the diffusion furnace while vaporizing at a rate of approximately one-half pint of water for each four square inches of furnace tube cross section. After the one hour of water vapor exposure, dry oxygen is started through the furnace at about 1000 cc. per minute for the remainder of the diffusion period. The use of water vapor followed by oxygen causes the formation of the thick and dense glass required for masking against a subsequent P diffusion of boron from a film of borosilicate glass. This treatment or pi silicon of 3 ohm-centimeter resistivity will produce an NP junction about 3 microns deep and will form a layer of glass about 5000 angstrom units thick.

After selectively etching away the necessary regions of calcium phosphosilicate glass, a film of borosilicate glass is formed on the silicon wafer largely using well-known techniques. The regions of the silicon that were stripped of glass are given a light coat of silicon dioxide by heating in water vapor at 900° C. for thirty minutes. A combustion tube furnace is used and water is vaporized at a rate of about one-half pint per hour for a four square inch furnace tube cross section. After the silicon dioxide is formed, the wafers are heated and exposed to boron trioxide vapor in a closed system. Boron trioxide and the silicon wafers are separated in a small closed quartz or molybdenum box which is then heated to 950° C. in hydrogen for about one hour to form the borosilicate glass. The box, which is not completely gas tight, is heated in a combustion tube furnace in an atmosphere of hydrogen. The hydrogen flow through the combustion tube is about 1000 cc. per minute for a tube of about four square inches in cross section.

After these prediffusion operations, the silicon wafers are removed from the box and transferred to a combustion tube type diffusion furnace where boron impurity from the borosilicate glass film is diffused into the silicon. The silicon, typically, is diffused at a temperature of 1100° C. for thirty minutes in dry hydrogen. The hydrogen flow is typically 400 cc. per minute through a four square inch cross section tube. The conditions given this P-type prediffusion and diffusion are requirements for a transistor based on the formation of an emitter junction at the same time as the anti-channel region is formed. In the case where the less critical anti-channel region is diffused alone, a lighter or heavier diffusion is acceptable. For the two diffusions previously described, a PN emitter-to-base junction will be formed at a depth of about 2 microns.

Using the previously described processing, planar passivated PNP transistors having a breakdown voltage characteristic (measured with the collector-to-base junction reverse biased, the emitter open circuited, and with a collector current of 10 microamperes) of over 60 volts are routinely fabricated. Before this invention, a breakdown voltage of 20 volts was considered fairly high for this general type of transistor.

High breakdown voltage planar passivated devices generally may be expected to have greater intrinsic and commercial value than the lower breakdown voltage devices. This invention makes it possible, with little added expense, to manufacture planar passivated NP, PNP, and other NP junction devices having high breakdown voltage characteristics. For each device, this is accomplished by the simple and direct means of selectively diffusing P impurity into pi silicon in a region peripheral to the surface of the NP junction so that an N-type induced channel cannot exist in this region, thereby isolating, limiting the size, and minimizing the effect of that part of the induced N-type channel adjacent the true N region.

More fundamentally, this invention also provides a means of forming and isolating variously shaped N-type channels on pi silicon.

I claim:

1. A method of making a semiconductor element for use in a semiconductor device to give such device high voltage breakdown and low reverse current characteristics, comprising growing an insulating coating on a surface of the element, opening a first area in the insulating coating, selectively diffusing an impurity through said area into the semiconductor body beneath a surface thereof to form a first region and a junction in said body which extends from within said body back toward the surface thereof, forming a layer of phosphosilicate glass over the insulating coating and over said first area on the surface of the element, opening a second area through said insulating coating and said layer of phosphosilicate glass, said second area completely surrounding said first area and spaced laterally away from and separated from the first area on said surface, with said second area completely surrounding said first region in the body of the element, and diffusing an impurity into said body through said second area to form a channel-interrupting region which is laterally spaced outside said first region, is of opposite conductivity type to that of said first region and extends to a depth in said body which is deeper than any channel region formed in said body immediately under the insulating coating so as to physically interrupt such a channel and direct the junction at the inside interface of the interrupting-channel region toward the surface of the element.

2. In a method of making a semiconductor element for a semiconductor device which provides high voltage breakdown and low reverse current characteristics for the device, which element has a first region of one conductivity type within the body of the element, method steps of forming insulating and diffusion-masking material over the entire top surface of said element, selectively forming a first opening in said insulating material down to the surface of said element, forming on said material and on said surface at said first opening a first layer of silicate glass containing a first impurity corresponding to a conductivity type opposite to that of said first region, diffusing said first impurity from said first silicate glass layer through said first opening to form in said body a second region of a conductivity type opposite to that of said first region, again forming insulating and diffusion-masking material over the entire top surface of said element, selectively forming second and third openings in said insulating material, with said second opening wholly within the outline of the second region at the top surface and with said third opening completely encircling and laterally spaced from said outline, forming a second layer of silicate glass on said last-mentioned material and on said top surface at said second and third openings containing a second impurity corresponding to a conductivity type which is the same as that of said first region, and diffusing said second impurity from said second silicate glass layer concurrently through said second and said third openings to form beneath said second opening a third region wholly within said second region of the same conductivity type as said first region, and to form in said body beneath said third opening a channel-interrupting region spaced laterally away from said second region and completely surrounding said second region, such diffusion of said second impurity into said body extending to a depth greater than the depth from said top surface of any channel which is formed immediately below said top surface of opposite conductivity type to that of said channel-interrupting region, with said channel-interrupting region in the operation of the semiconductor device serving to block the flow of large reverse currents through such a channel.

3. In the manufacture of a semiconductor device which includes a semiconductor element with two adjacent regions of opposite conductivity type having means in the element when the device is connected into a circuit for improving the voltage breakdown characteristics of the device by confining voltage breakdown to a portion within the body of the element and for improving the reverse current characteristics of the device, said semiconductor element having a junction at an interface of said two adjacent regions in the body thereof and having a high-resistivity portion in the body of the semiconductor element at the surface thereof adjacent one of the two adjacent regions and within the other of the two regions which is capable of having a high-resistivity surface-channel formed therein of a conductivity-type opposite to the conductivity type of the other of the two regions which extends said junction from its original position laterally outwardly in the body of the element along the interface of any such surface-channel within said body and having an insulating coating over said entire top surface with an opening in the coating, the steps of forming through said coating opening and through any such surface-channel down into said body a channel-interrupting region which is spaced laterally away from the original interface of said two adjacent regions, which completely surrounds the junction, is deeper in said body from said surface than any such surface-channel formed therein, and is of opposite conductivity type to that of any such surface-channel, said lateral spacing being greater than the width of any depletion region formed in the operation of such device, and forming a coating of insulating material over the entire top surface of said element.

4. In a method of making a semiconductor element for a semiconductor device which provides high voltage breakdown and low reverse current characteristics for the device, which element has insulating material on the surface thereof, a first region of one conductivity type within the body of the element, a second region of the opposite conductivity type within said body encompassed within said first region and contiguous thereto, and a junction at the interface of said two regions; the steps of selectively opening said insulating material down to the surface of said element, and diffusing an impurity through said opened insulating material to form in said body a channel-interrupting region spaced laterally away from said second region and completely surrounding said second region, which is of the same conductivity type as said first region, such diffusion of the impurity into said first region extending downwardly entirely through any channel which is formed immediately below said element surface and with such channel extending lateraly out of said second region into said first region and being of opposite conductivity type to that of said channel-interrupting region.

5. In the method of claim 4 wherein said insulating material is opened above said second region and is opened at a place spaced therefrom a predetermined amount completely encircling the same, and concurrently forming by the same impurity diffusion step both a third region within said second region and said channel-interrupting region.

6. In the fabrication of a semiconductor element for use in a semiconductor device, said element having an insulating coating on one surface thereof and having a first region of a predetermined conductivity type and of a predetermined resistivity, the method of making a first opening in the insulating coating extending down to the surface of said element, diffusing a first impurity through said first opening into the element in a portion defined by said first opening thereby forming a second region in the element with a conductivity type opposite to said predetermined conductivity type of said first region, forming a new insulating coating over the surface of the element at said first opening, making a second opening in the insulating coating which completely surrounds the junction between the first and the second regions at the surface of the semiconductor element and spaced laterally outwardly from said junction, diffusing a second impurity through said second opening to form a third region in said semiconductor element in a portion thereof defined by said second opening, said third region being of said predetermined conductivity type of said first region and having a resistivity lower than the predetermined resistivity of said first region, with the second impurity diffusion extending to a depth in the semiconductor element greater than the depth of any channel forming in the first region immediately below and contiguous with the insulating coating between said second region and said third region, said third region serving to interrupt and block the flow of large reverse currents through any such channel in the operation of the fabricated element in a semiconductor device.

References Cited by the Examiner

UNITED STATES PATENTS

| | | | |
|---|---|---|---|
| 2,936,410 | 5/1960 | Emeis | 317—235 |
| 2,954,307 | 9/1960 | Shockley | 148—187 |
| 3,102,230 | 8/1963 | Kahng. | |
| 3,158,788 | 11/1964 | Last. | |
| 3,183,128 | 5/1965 | Leistiko | 317—235 X |
| 3,226,611 | 12/1965 | Haenichen | 317—234 |

HYLAND BIZOT, *Primary Examiner.*

WILLIAM I. BROOKS, JOHN F. CAMPBELL, *Examiners.*